United States Patent
Kumakura

Patent Number: 5,892,776
Date of Patent: *Apr. 6, 1999

[54] SEMICONDUCTOR MEMORY AND TEST METHOD INCORPORATING SELECTABLE CLOCK SIGNAL MODES

[75] Inventor: Shinsuke Kumakura, Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 583,938

[22] Filed: Jan. 11, 1996

Related U.S. Application Data

[63] Continuation of Ser. No. 281,024, Jul. 27, 1994, abandoned.

[30] Foreign Application Priority Data

Aug. 31, 1993 [JP] Japan ................................. 5-216008

[51] Int. Cl.$^6$ ............................................. G11C 29/00
[52] U.S. Cl. ................................. 371/21.1; 324/73.1
[58] Field of Search ........................ 371/21.1, 21.2, 371/21.4, 27.6, 27.7, 24, 26, 22.5, 22.6; 365/189.12; 324/73.1, 158.1; 364/556, 557

[56] References Cited

U.S. PATENT DOCUMENTS

| | | | |
|---|---|---|---|
| 4,697,140 | 9/1987 | Saito et al. | 324/73 R |
| 4,747,079 | 5/1988 | Yamaguchi | 365/189 |
| 4,866,544 | 9/1989 | Hashimoto | 360/40 |
| 4,965,799 | 10/1990 | Green et al. | 371/21.2 |
| 5,285,409 | 2/1994 | Hwanngbo et al. | 365/189.12 |
| 5,453,993 | 9/1995 | Kitaguchi et al. | 371/22.5 |

OTHER PUBLICATIONS

Patent Abstracts Of Japan, Japanese Kokai Publication No. 61–258399 A, published Nov. 15, 1986, "Semiconductor Integrated Circuit Device", Yoshihiro et al.
Patent Abstracts of Japan, Japanese Kokai Publication No. 60–001700 A, published Jan. 7, 1985, "Pseudo Static Memory Circuit", Kazuo.

*Primary Examiner*—Hoa T. Nguyen
*Attorney, Agent, or Firm*—Nikaido, Marmelstein, Murray & Oram LLP

[57] ABSTRACT

A semiconductor memory is provided with a select circuit and a control circuit. The select circuit selects either a master clock signal or a test clock signal supplied to a specific terminal, based upon a mode selection signal supplied to a specific terminal. The control operation writes, reads and erases data of the memory cells in response to the master clock signal or the test clock signal. A semiconductor memory test method includes a number of steps, including supplying a mode selection signal, which is higher than normally used voltage, to a specific terminal, and a test clock signal is supplied to another specific terminal; the master clock signal and the test clock signal are then switched in response to the mode selection signal; the data writes and erases relating to the cells of the memory are then tested based upon the test clock signal. In other semiconductor memory test method, two or more specific terminals are first selected, and are supplied with a mode selection signal which is higher than a normally used voltage; then, a master clock signal with a predetermined frequency is selected based upon the mode selection signal. The data writes and erases relating to the cells of the memory are tested based upon the master clock signal with the predetermined frequency.

5 Claims, 14 Drawing Sheets

SEMICONDUCTOR MEMORY AND TEST METHOD INCORPORATING SELECTABLE CLOCK SIGNAL MODES

This application is a continuation of application Ser. No. 08/281,024 filed Jul. 27, 1994, now abandoned.

BACKGROUND OF THE INVENTION

1. Field of the Invention

This invention relates to a semiconductor memory and its test method, more particularly to improvements of automatic test functions of read only memory which permits electrical writing or erasing of information.

2. Description of the Related Art

Recently, the amount of processed data in an information processing system has been steadily increasing. Particularly in the field of voice and image processing, as microprocessors or central processing units of high ability and high performance are used, semiconductor memories are used as memories for storing their control programs.

As a typical example for such device, flash memory is widely known. Flash memory can be electrically programmed and moreover its programmed contents can be erased together.

Now, it will be useful to explain related arts of the invention. For example, as shown in FIG. 1, a programmable ROM (read only memory) which information can be electrically written to or erased from comprises the memory cells 1, a write/read (write and read) circuit 2, an address decoder 3 and an automatic control circuit 4.

The memory cells 1 comprises a memory cell matrix 1A, Y-gates 1B and a source control circuit 1C for erasing. A write/read circuit 2 comprises a sense/write amplifier 2A and an input/output buffer 2B. The address decoder 3 comprises a column address latch buffer 3A, a row address latch buffer 3B, a block address latch buffer 3C, a column address decoder 3D, a row address decoder 3E and a block address decoder 3F.

The automatic control circuit 4 comprises a command register 4A, a status register 4B, CE/OE/WE control logic 4C, a data comparator 4D, a write/erase selector 4E, a write/erase timing generator 4F and a clock generating section 4G. It is noted that the automatic control circuit 4 is provided with a self-test function.

As shown in a broken line circle of FIG. 1, each memory cell 1 includes a control gate CG and a floating gate FG, and stores data D by having charges injected into its floating gate FG.

In a data write operation of the memory, a control command for writing is input to the automatic control circuit 4 in the first place. When the writing high voltage VPP and an address AO–An are specified, charges are injected into the gate FG of the memory cell 1 at the location specified by the address decoder 3 and data D is written on the basis of the master clock signal by the write/read circuit 2.

In a data read operation, a read enable signal is first input to the automatic control circuit 4. And when normally used voltage VCC and an address AO–An are specified, the memory cell at the location specified by the address decoder 3 performs an "ON" operation, and therefrom is read data D on the basis of the master clock signal by the write/read circuit 2.

In a erase operation, a control command for erasing is first input to the automatic control circuit 4. When the erasing high voltage VPP and an address AO–An are specified, charges are removed from the gate FG of the memory cell 1 at the specified location and data D is erased on the basis of the master clock signal.

In a flash memory provided with a function for self-testing these fundamental operations, as shown in FIG. 2, the LSI tester 5 supplies a control command DIN to the memory 6. Then the flash memory 6, which is the target of the test, performs data write, read and erase operations according to a master clock signal and on the completion of a series of test operations, outputs the test results DOUT to the LSI tester 5.

It should be noted that a flash memory without a self-test function needs the supply of the control command DIN as well as test signals based on a predetermined algorithm.

SUMMARY OF THE INVENTION

One object of the invention is to detect the state of voltage applied to a specific terminal, and to test write/erase operations on the basis of the usually used clock signal or the test clock signal with a frequency different from the former, that is, to make operational tests easily substituting a test clock signal for a master clock signal.

Further object of the invention is to detect the state of voltage applied to two or more specific terminals, and to test the memory at a high speed based on a clock signal with a frequency higher than a normally used clock signal. In other words, the present invention is intended for the enhancement of a self-test function and the reduction of the test period by means of the selection between a normally used clock and a test clock signal.

Specifically, a first semiconductor memory of the invention, a preferred embodiment of which is shown in FIG. 3, is provided with a select means and a control means. The select means selects either one of the master clock signal and the test clock signal supplied to specific terminal according to a mode selection signal applied to another specific terminal. The control means writes, reads and erases data of the memory cells on the basis of either the master clock signal or the test clock signal.

A second semiconductor memory of the invention is provided with a control means and at least two clock generation means. The control means writes, reads and erases data of the memory cells on the basis of a clock signal of a predetermined frequency. The clock generation means output clocks of predetermined frequencies on the basis of the detection of mode selection signal applied to a specific terminal.

In a first test method for semiconductor memories, a preferred embodiment of which is shown in FIG. 4, the mode selection signal which is higher than normally used voltage is first applied to a specific terminal, and a test clock signal is applied to another specific terminal; then, the master clock signal and the test clock signal are switched in response to the mode selection signal; and the data writes and erases relating to the cells of the memory are tested on the basis of the test clock signal.

In a second method for semiconductor memories, a preferred embodiment of which is shown in FIG. 5, two or more specific terminals are first selected and thereto are applied respective a mode selection signal which are higher than normally used voltage; then according to the respectively applied mode selection signal, a master clock signal with a predetermined frequency is selected; and thereafter the data writes and erases relating to the cells of the nonvolatile memory are tested on the basis of the master clock signal with the predetermined frequency.

Employing such circuit configurations and test methods enables a high speed test independent of the process speed in normal operation and promotes the speed-up of operational tests and the reduction of the testing cost concerning semiconductor memories such as a flash memory. Also, the automatic control circuit could be advantageously operated from outside, when something abnormal was found in the clock generator.

DETAILED DESCRIPTION

Figure 1A:
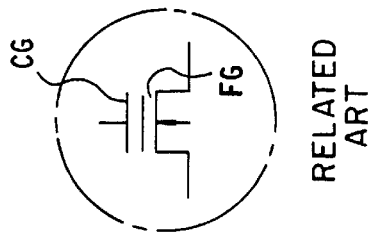
FIG. 1 is a diagram showing an arrangement of a flash memory according to the related art of the invention.
Figure 1:
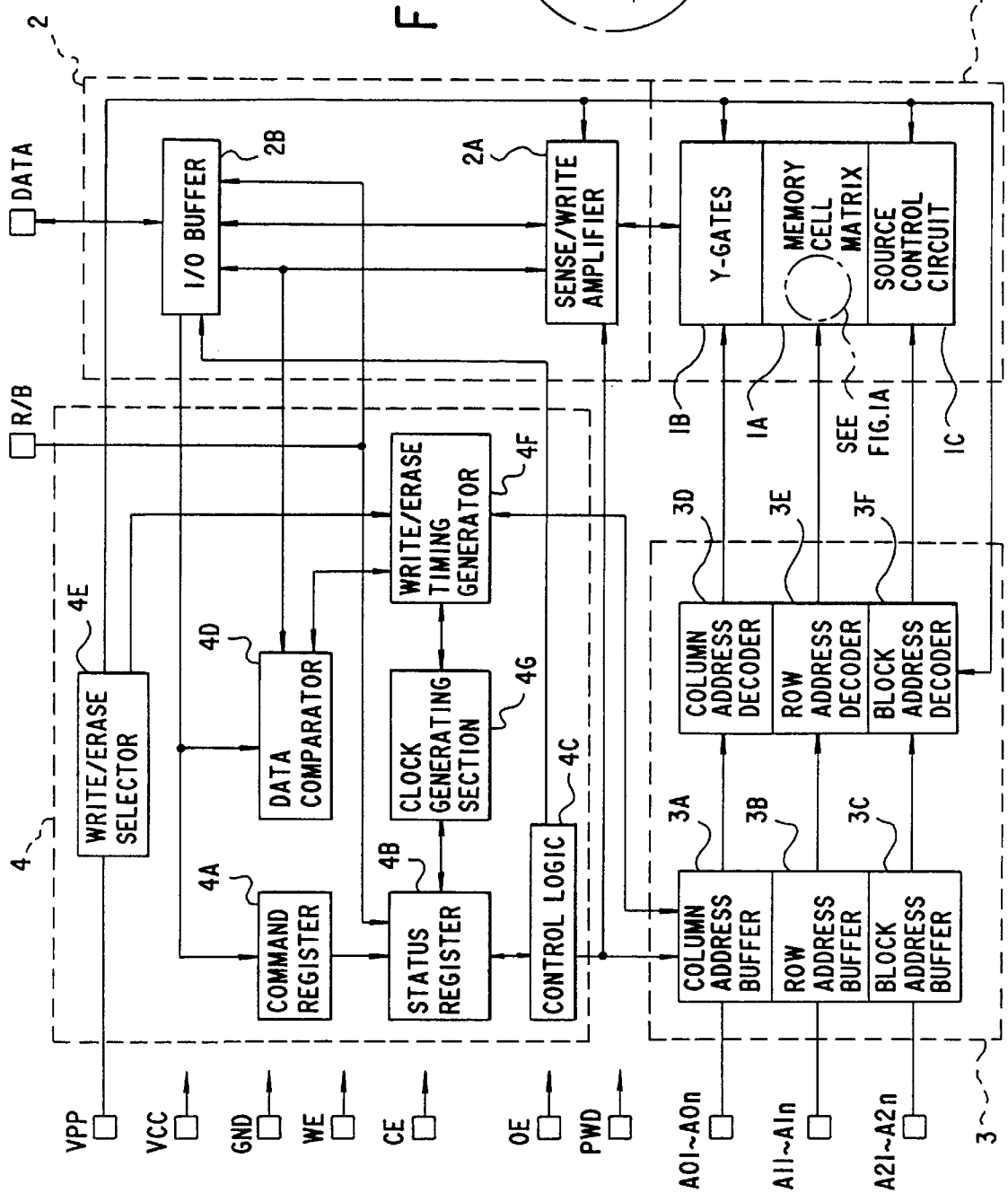
Figure 2:
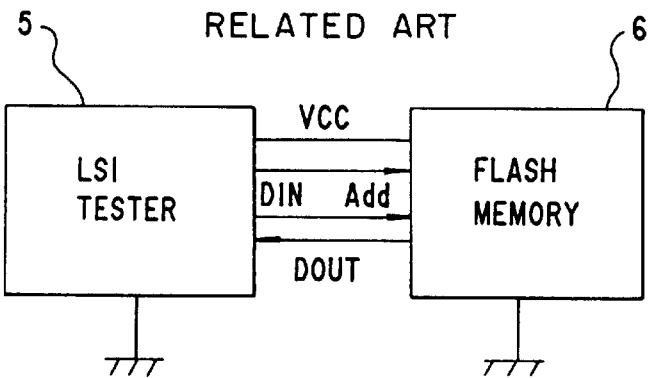
FIG. 2 is a diagram showing an illustrative arrangement of a flash memory test method according to the related art of the invention.

Now, according to the test method of the flash memory 6 provided with a self-test function of the related art of the invention, on the input of the control command DIN for writing or erasing, an operational test of the memory is performed on the basis of the master clock signal as shown in FIG. 2.

Thus, since a series of tests of data writes, reads, erases, etc. is performed by means of addresses generated on the basis of the master clock signal, it takes a test period dependent on the processing speed in normal operation. That is, once the flash memory 6 with a automatic control circuit 4 built-in receives a control command DIN from outside, it processes all internally and automatically until the writes or erases of the storage cells are completed.

In determining the operational state of the memory from outside, the contents of the flags of the status register provided in the automatic control circuit 4 will be examined. Further, in memories of this type, when there is something wrong with the clock generating part itself, a correct self-test is impossible.

Thus, as the memory capacity increases with the advance of functions and performance of information processing, it will take more time to get the test results after the control command DIN has been input.

There are following problems in the related art. The above described fact prevents the increase in the processing speed of operational verification of the flash memory, and makes subsequent circuit tests difficult. And this also prevents the reductions in a testing cost and testing time.

Figure 3:
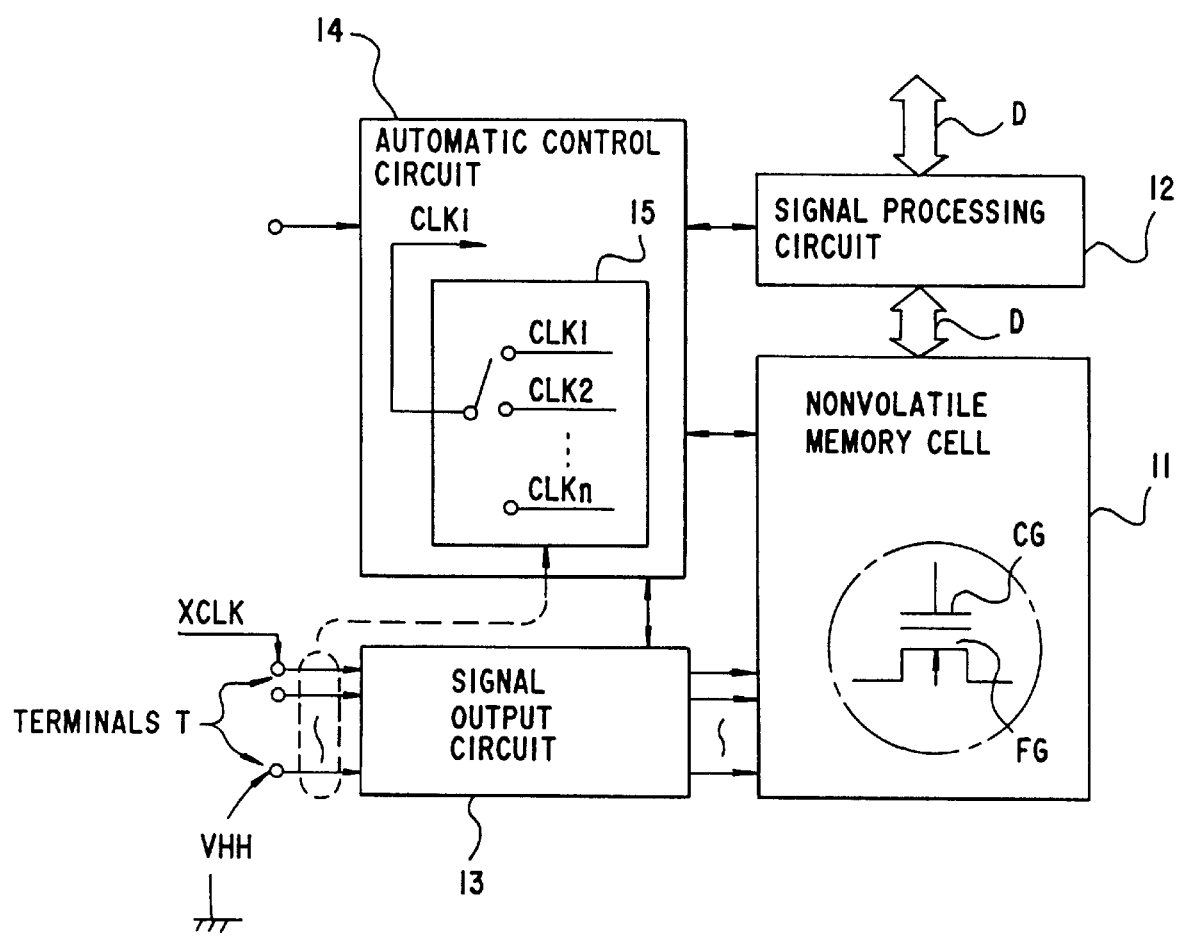
FIG. 3 is a diagram showing a principle arrangement of a semiconductor memory according to the present invention.

On the other hand, a first semiconductor memory according to the principles of the invention has a automatic control circuit 14 and a clock control circuit 15 as shown in FIG. 3. The automatic control circuit 14 automatically executes write/erase operation on the basis of the master clock signal CLK1...n. The master clock signal CLK1...n is a signal making the base of a timing signal for writes and erases of the nonvolatile memory cells 11. The clock signal circuit 15 makes the master clock signal CLK1...n changeable.

Figure 4:
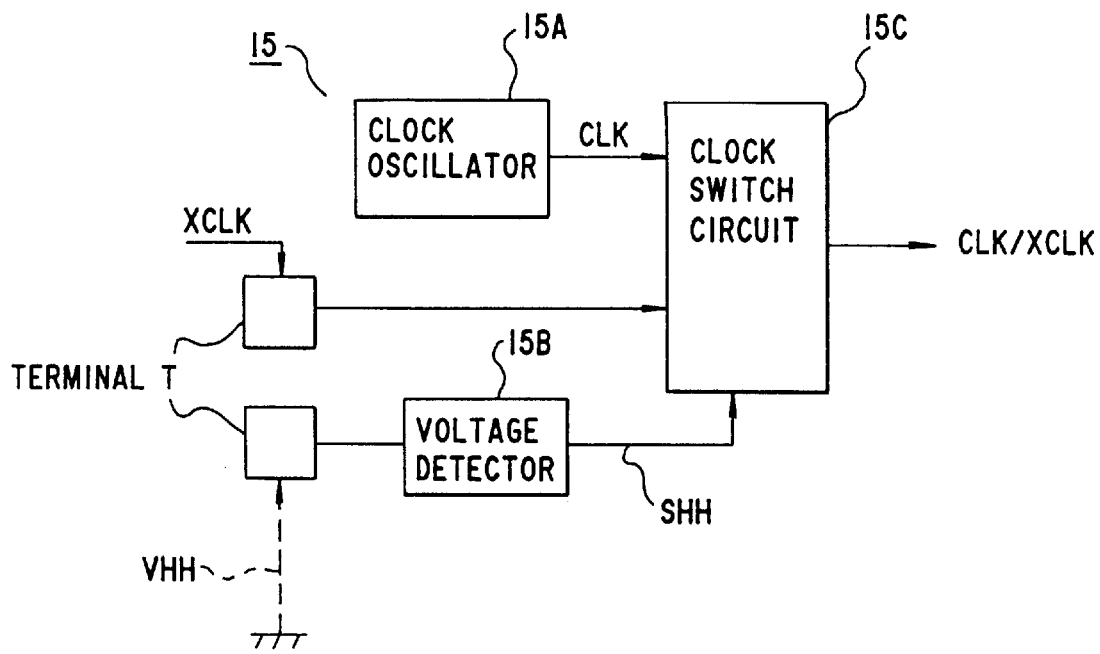
FIG. 4 is a diagram showing an illustrative arrangement of a first principle test method for the semiconductor memory shown in FIG. 3.

In the first semiconductor memory of the invention, as shown in FIG. 4, the clock control circuit 15 is provided with a clock oscillator 15A, a voltage detector 15B and a clock switching circuit 15C. The clock oscillator 15A generates the master clock signal CLK necessary for normal operation. The voltage detector 15B is connected to a specific terminal T and detects the state of the voltage applied to the specific terminal T. The clock switching circuit 15C outputs either the master clock signal CLK necessary for normal operation or the testing master clock signal XCLK necessary for test operation on the basis of the detected output of the voltage state at the specific terminal T.

Also in the first semiconductor memory of the invention, a test clock signal XCLK is supplied from outside via a specific terminal T of the usually used terminals.

In a second semiconductor memory of the invention, the clock output circuit 15 comprises two or more clock generation means Cn (n=1,2,j,..., n). The clock generation means Cn have their output connected together and each comprises a clock oscillator 15D, a voltage detector 15E and an output control circuit 15F. The clock generating circuit 15D generates a clock signal CLK1... with a predetermined frequency. The voltage detector 15E is connected to a specific terminal T and detects the state of voltage applied to the specific terminal T. The output control circuit 15F performs the output control of the clock signal CLK1... with a predetermined frequency on the basis of the detected results of the voltage state.

In a first semiconductor memory test method in accordance with the principles of the invention, a voltage VHH which is higher than that in case of normal use is applied to a specific terminal T of the signal output circuit 13, and a test clock signal XCLK is supplied to another specific terminal T as shown in FIG. 3.

The method is intended for the first semiconductor memory of the invention and enables the test clock signal XCLK supplied to the other specific terminal T to change its frequency.

In a second semiconductor memory test method of the invention, two or more specific terminals T connected to the voltage detector 15E are selected, and to the specific terminals T is applied a voltage VHH higher than that in case of normal use.

According to the first theoretical semiconductor memory of the invention, a high speed test independent of the access speed in normal operation is possible because an operational test of the memory is performed on the basis of a clock signal CLKi with a frequency different from a usually used frequency, for example, a test clock signal XCLK as shown in FIG. 3.

That is, in a operational test of the memory, as shown in FIG. 4. to a specific terminal T is applied a voltage VHH higher than that in normal use, and to another specific terminal T is applied a test clock signal XCLK. the voltage VHH applied to the specific terminal T is detected by the voltage detector 15B, and the detection signal SHH is output to the clock switching circuit 15C.

Then, on the basis of the detection signal SHH, the clock switching circuit 15C selects the test clock signal XCLK necessary for test operation instead of the clock signal necessary for normal operation. Thus, the operation test of the memory is performed on the basis of the test clock signal XCLK.

Specifically, addresses are automatically generated by the signal output circuit 13 on the basis of the test clock signal XCLK through the control circuit 14. On the basis of the addresses, in a data write test for example, the signal processing circuit 12 injects charges into floating gates FG on the memory cells 11 to cause data D to be automatically written.

In a data read test, the signal processing circuit 12 makes the memory cells ON state to cause data D to be automatically read. And, in a data erase test, charges are removed from the gates FG of the memory cells 11 by the signal processing circuit 12, which causes data D to be automatically erased.

In this case, the frequency of the test clock signal XCLK may be changeable. Then it makes a higher speed test possible by supplying a higher speed clock signal from outside. In order to cause the memory to restore its normal operation, the supply of the voltage VHH is stopped and normally used voltage is applied to each terminal. This causes the clock switching circuit 15C to select the clock signal CLK generated by the clock oscillator 15A, on the basis of which the memory operates regularly.

Figure 5:
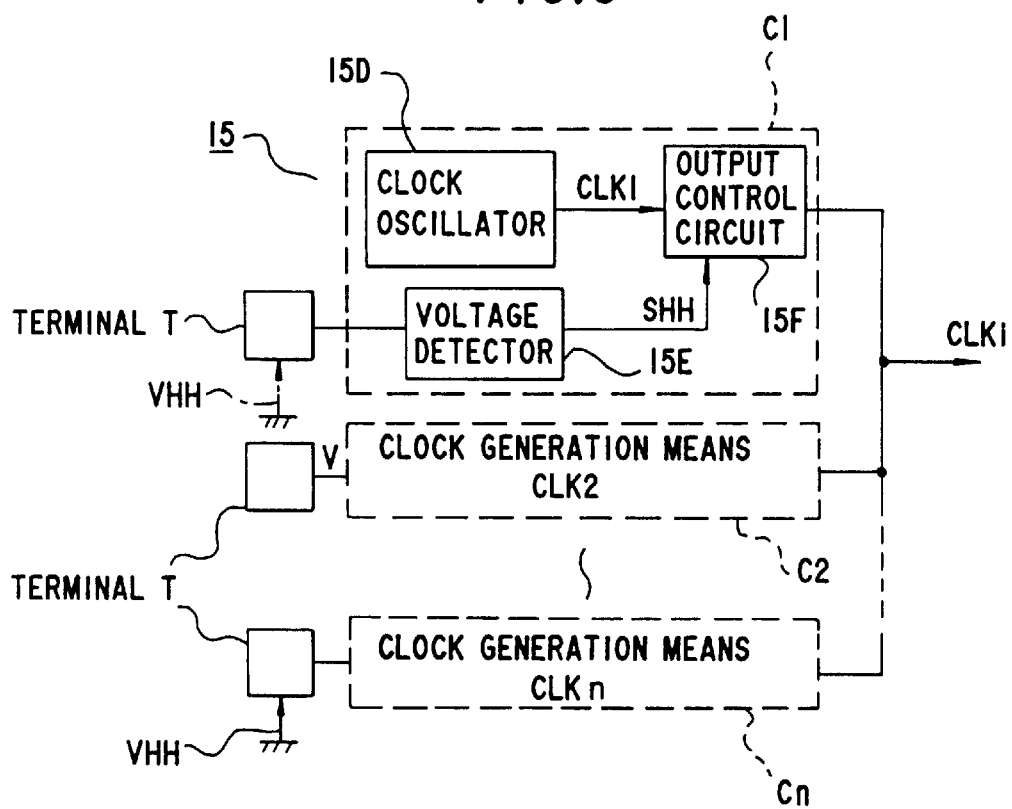
FIG. 5 is a diagram showing an illustrative arrangement of a second principle test method for the semiconductor memory shown in FIG. 3.

Further, in the second semiconductor memory of the invention, as shown in FIG. 5, there is provided a clock output circuit 15 comprising at least two clock generation means Cn with their outputs connected together, one clock generating unit (for example, C1) comprising a clock generating circuit (in this case 15D), a voltage detector 15E and a output control circuit 15F.

This enables a high speed test independent of the access speed in normal operation, since an operational test of the memory can be done on the basis of a clock signal CLKi which has a frequency higher than that in case of normal use, and is based on the status of the voltage applied two or more specific terminal T.

That is, in an operational test of the memory, shown in FIG. 5, two or more specific terminals connected to the voltage detector 15E are selected and a voltage higher than that in case of normal use is applied to the selected terminal. Then, the voltage VHH applied to the specific terminal T is detected by the voltage detector 15E, the detection signal SHH is output to the output control circuit 15F.

Here, on the basis of the detection signal SHH, the output control circuit 15F permits output operation of the clock oscillator 15D. This causes the output control circuit 15F to output the test clock signal CLKi necessary for test operation instead of the clock signal CLK1 necessary for normal operation. On the basis of the test clock signal CLKi, an operational test of the memory is performed.

Referring to the drawings, we discuss the illustrative embodiments of the invention in the followings.

(1) A First Preferred Embodiment

Figure 6:
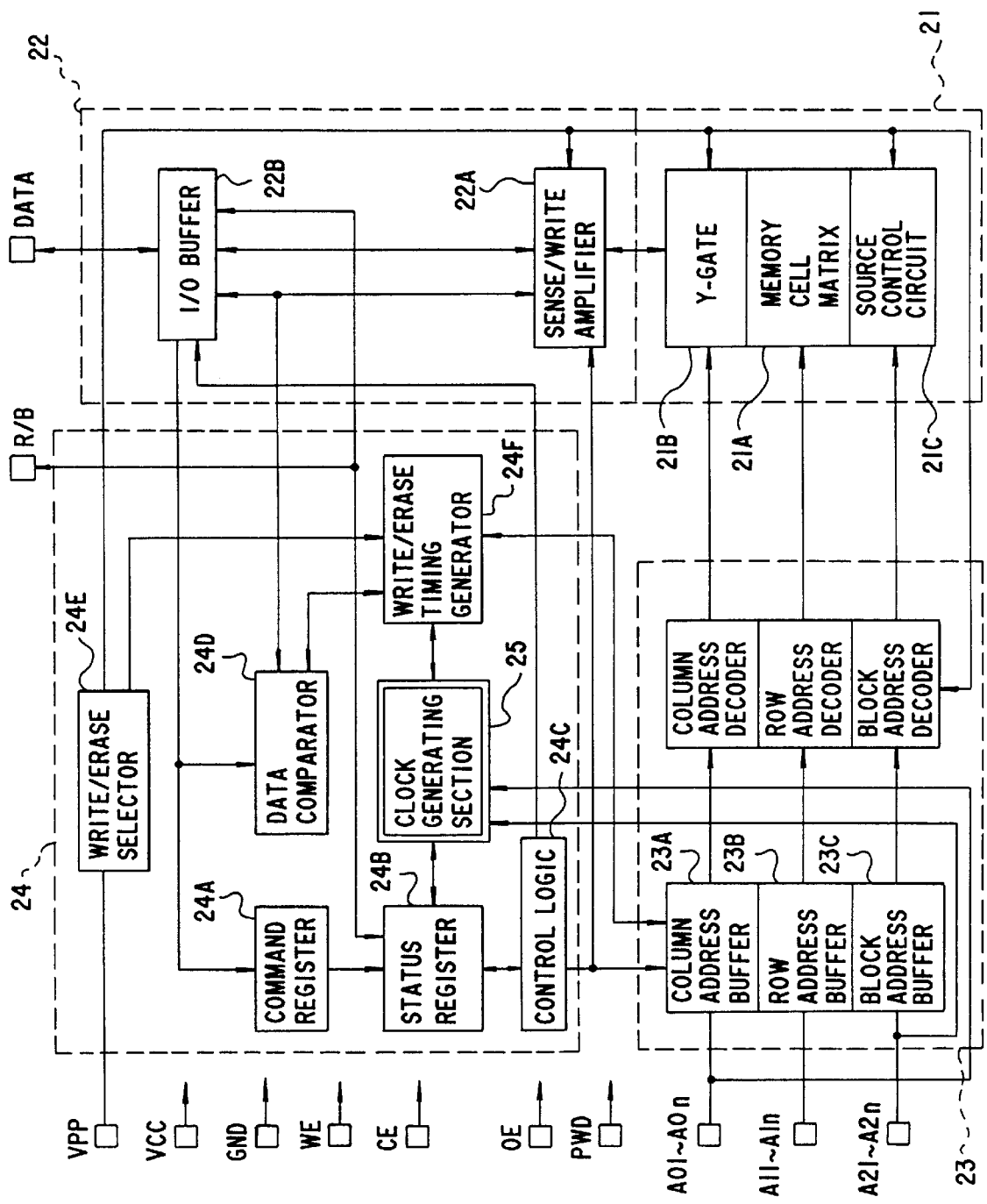
FIG. 6 is a diagram showing an arrangement of a flash memory according to a first preferred embodiment of the invention.

A programmable ROM (read only memory) which information can be electrically written to or erased from, for example, comprises a memory cell array 21, a read/write circuit 22, an address decoder 23 and an automatic control circuit 24 as shown in FIG. 6.

Specifically, the memory cell array 21 is an illustrative embodiment of the memory cells 11 as shown in FIG. 3, and comprises a memory cell matrix 21A, Y-gate 21B and source control circuit 21C for erasing. The details of a memory cell arrangement for one bit and an arrangement of the memory cell array will be described in relation to FIG. 7A through 7C and FIG. 8, respectively.

The read/write circuit 22 is an illustrative embodiment of the signal processing circuit 12, and comprises a sense/write amplifier 22A and an input/output buffer 22B. The sense/write amplifier 22A is a circuit for writing or reading data D. The input/output buffer 22B is a circuit for outputting data D to outside or inputting data D from outside.

The address decoder 23 is an illustrative embodiment of the signal output circuit 13, and is a circuit for decoding n-bit addresses A01–A0n, A11–A1n, and A21–A2n relating to data writes or reads. For example, the address decoder 23 comprises a column address latch buffer 23A, a row address latch buffer 23B, a block address latch buffer 23C, a column address decoder 23D, a row address decoder 23E and a block address decoder 23F, and outputs a gate selection signal for selecting a memory cell 11.

The automatic control circuit 24 is an illustrative embodiment of the control circuit 14 and is a circuit for automatically controlling data D writes, erases or reads. For example, The automatic control circuit 24 comprises a command register 24A for holding control command, a status register 24B for holding control flags, a CE/OE/WE control logic 24C, a data comparator 24D for comparing read and write data, a write/erase selector 24E, a write/erase timing generator 24F and a clock generating section 25.

The CE/OE/WE control logic 24C is a circuit for outputting the logic of a chip enable signal CE, an output enable signal OE and a write enable signal WE. The write/erase selector 24E is a circuit for shifting the operation of the memory according to a write voltage VPP. The write/erase timing generator 24F generates a timing signal for data D writes or erases on the basis of either the clock signal CLK or the test clock signal XCLK. The circuit 24F has an address counter built in, which will be detailed in FIG. 11 and 12.

The clock generating section 25 is an illustrative embodiment of the clock output circuit 15 and is a circuit for selecting and outputting either one out of the clock signal CLK in normal operation and the test clock signal XCLK on the basis of the state of the voltage applied to a specific terminal T of the usually used terminals. More details of the clock generating section 25 will be given in FIG. 9.

Figure 7A:
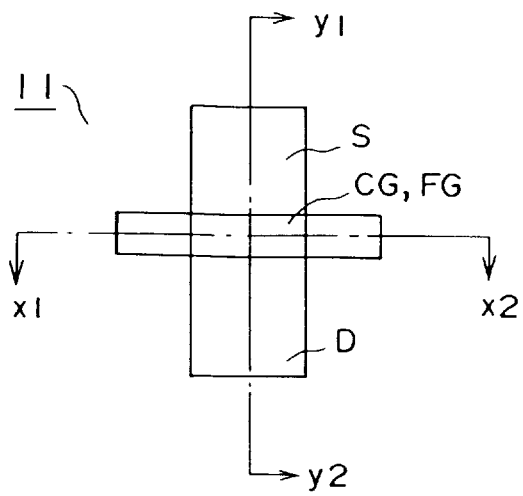
FIG. 7A is a plan view of a memory cell of one bit in the flash memory shown in FIG. 6.
Figure 7B:
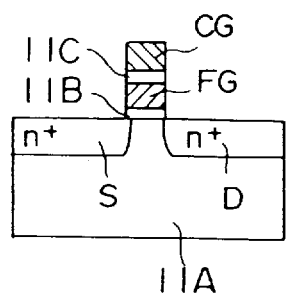
FIG. 7B is a y1–y2 cross-sectional view of the memory cell of one bit shown in FIG. 7A.
Figure 7C:
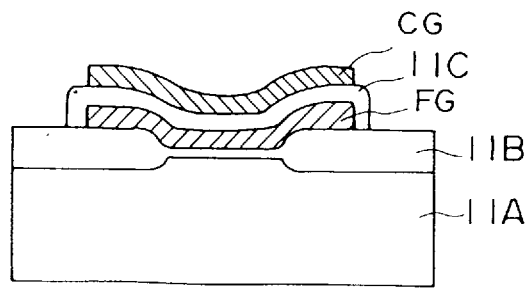
FIG. 7C is a x1–x2 cross-sectional view of the memory cell of one bit shown in FIG. 7A.

Next, we discuss the arrangement of the memory cells 11. For example, as shown in FIG. 7A through 7C, a memory cell 11 of one bit comprises a source region S, a drain region D, a floating gate FG (hereinafter, merely referred to merely as "gate") and a control gate CG (hereinafter, merely referred to as "gate"), the last two being disposed on the first two.

Specifically, a source region (hereinafter, merely referred to as "source") S and a drain region (hereinafter, merely referred to as "drain") D, which are formed of $n^+$-type impurity diffused layers, are provided in a p-type Si substrate 11A. And the both gates FG and CG are disposed in order on the area crossing the source S and the drain D interposing $SiO_2$ films 11B and 11C with the thickness of about 100 Å. It is noted that the $SiO_2$ film 11B is called "a tunnel oxide film" and the gates CG and FG are capacitively coupled. Thus, the memory cell 11 has the arrangement in which a floating gate FG is provided under the gate CG of an n-channel MOS transistor interposing an $SiO_2$ film 11C.

In a data write operation of the memory cell 11, the charges of the floating gate FG in the initial state is null, which is defined as logical information "1". In this state, by setting the potential of the substrate 11A and source S to be 0 V, setting the gate CG to be 5 V and the drain D to be 1 V, the potential of the gate FG rises to about 3 V because of the capacitive coupling to cause the transistor to be in a conductive state.

Thereafter, by applying voltage of 12 V and 6 V to the gate CG and the drain D respectively with the potentials of the substrate 11A and the source S being 0 V, what is called an avalanche breakdown phenomenon occurs to cause a lot of high energy electrons in the neighborhood of the drain D to be captured. This is a write of data.

In this state, when the gate CG is made 5 V and the drain D is made 1 V, then the floating gate FG becomes low potential such as −2 V. Consequently, the transistor turns into a nonconductive state, which is defined as logical information "0".

Here, by setting the gate CG of the substrate 11A to be 0 V, making the drain D open, and applying a voltage of about 12 V to the source S, what is called the tunnel effect appears, that is, electrons tunnel from the floating gate FG to the source S, and accordingly the number of electrons at the gate FG decreases. Controlling the tunnel time makes it possible to remove nearly all the electrons from the floating gate FG, which is an erase of data.

That is, a write of data means changing the information of the memory cell from "1" to "0" by means of an avalanche breakdown phenomenon. And, an erase of data means changing the information from "0" to "1" by means of the tunnel effect.

In the flash memory, desired information is stored by setting information of all the memory cells to be "1" by means of an erase and introducing information "0" into the predetermined memory cells 11 by writing. For example, when the drain D and the gate CG are impressed with voltage of 1 V and 5 V respectively, the memory cells 11 of information "1" pass drain currents but the memory cells 11 of information "0" do not pass drain current, which is data read operation.

Figure 8:
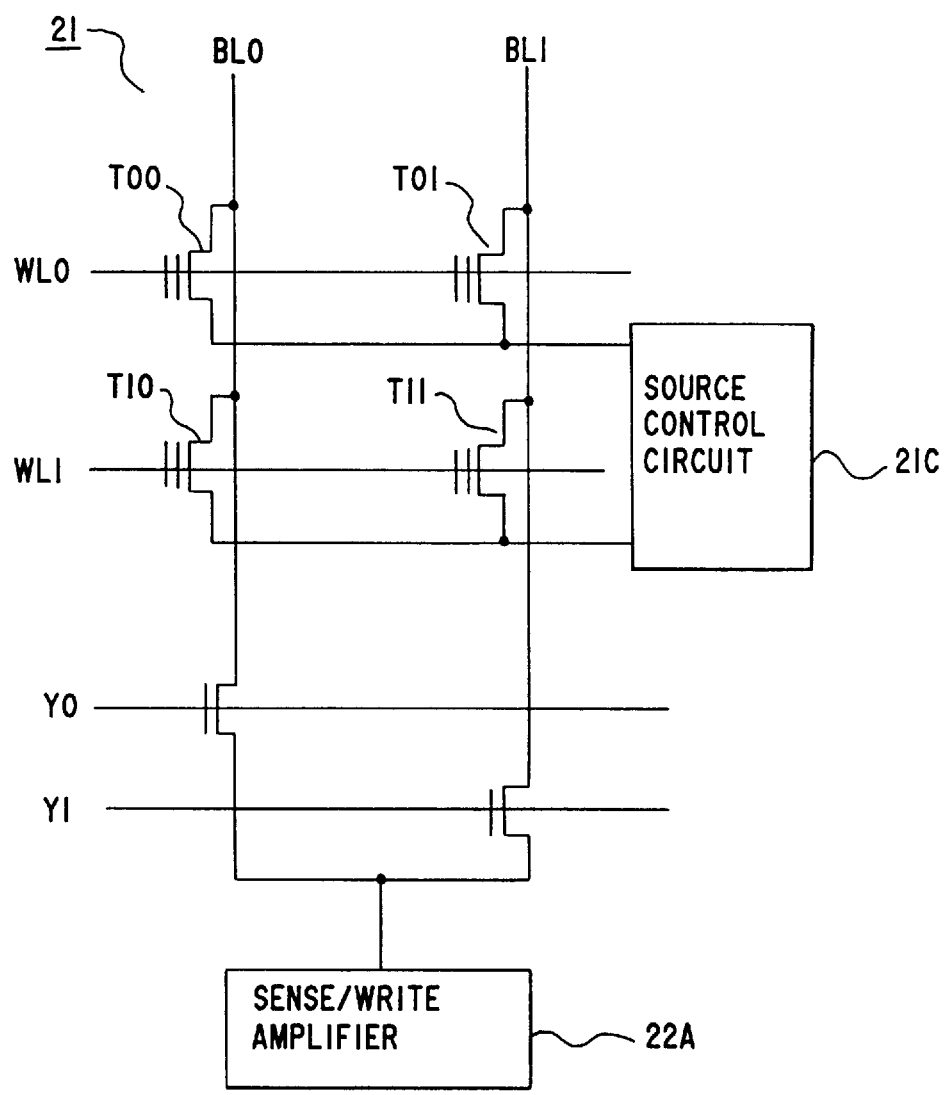
FIG. 8 is a diagram showing an arrangement of a memory cell array using memory cells shown in FIG. 7A.

Next, we discuss the arrangement of a memory array 21. FIG. 8 shows the circuit of the memory array 21. The memory cell array 21 comprises memory cells disposed in a matrix. For example, as shown in FIG. 8, the four memory transistors T00 through T11 (hereinafter, simply referred to as "transistor") composes the array 21 as one unit. Each control gate of the transistor T00 and T01 are connected to a word line WL0 and each control gate of the transistor T10 and T11 are connected to a word line WL1.

Also, each drain of the transistor T00 and T10 are connected to a bit line BL0 and each drain of the transistor T01 and T11 are connected to a bit line BL1. Each bit line BL0, BL1 is connected to a sense/write amplifier 22A via a Y gate 21B (the transistors for bit selection). A source of each transistor T00 through T11 is connected to a erasing source control circuit 21C, which controls the potentials of the substrate 11A and source S.

For example, when information is written to transistor T00: the potential of the source is fixed to 0 V by the source control circuit 21C; the voltage 12 V and 0 V are applied to word line WL1 and bit line BL1, respectively. It is noted that no write operation is performed for transistors T10, T01 and T11.

Erase is performed simultaneously for the transistors T00 through T11. That is, the word lines WL0 and WL1 are made 0 V, the bit lines BL0 and BL1 are made electrically open, and the source potential is raised to 12 V.

When information is read from the transistor T00, the source potential is fixed to 0 V, the word line WL0 is set 5 V, and the word line WL1 is set 0 V. And, setting the bit line BL0 to be 1 V, the sense amplifier 22A detects whether the drain current passes or not. If it passes through the bit line BL0, the information of the transistor T00 is "1". Otherwise, it is "0".

Figure 9:
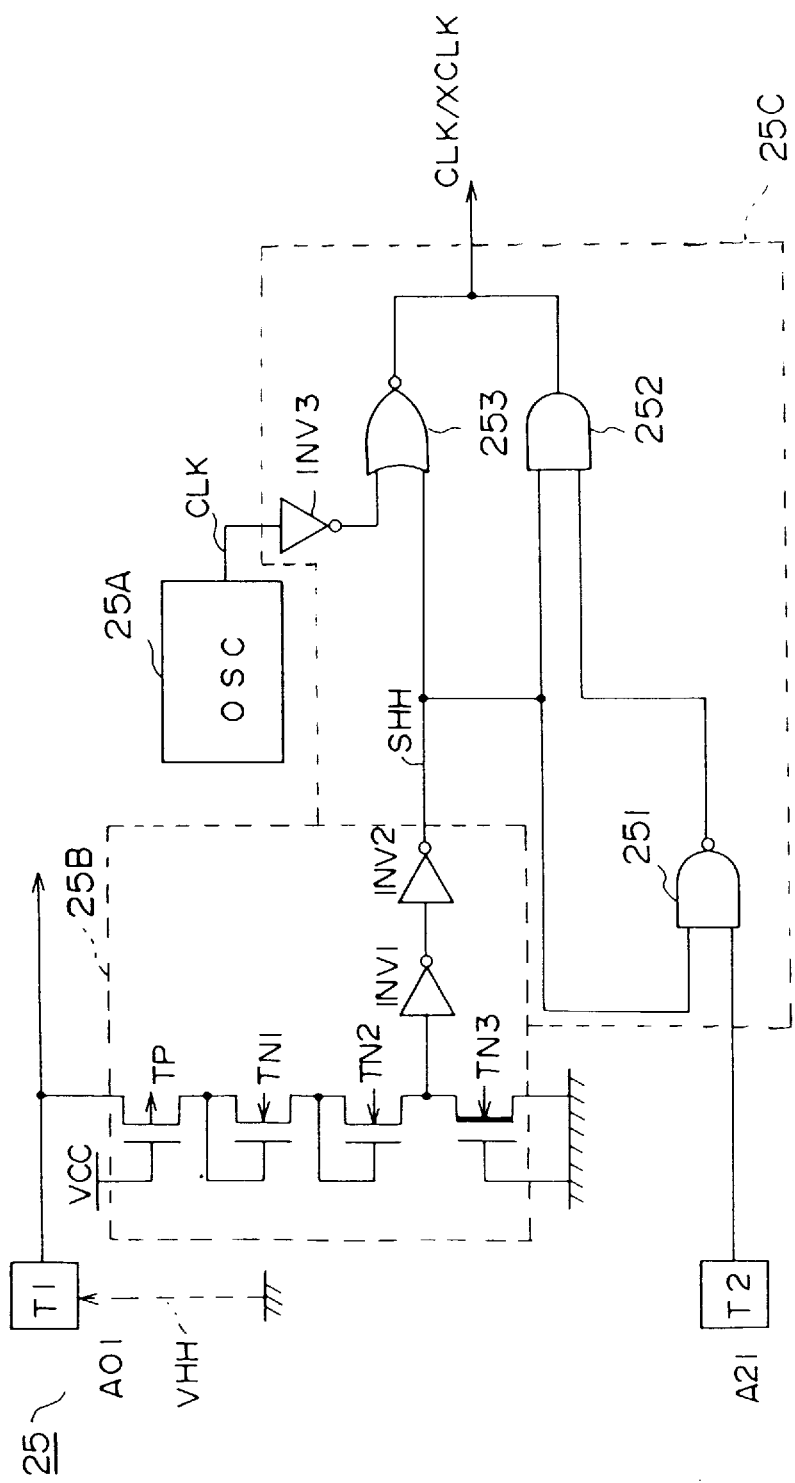
FIG. 9 is a diagram showing an internal arrangement of the clock generating part of the flash memory shown in FIG. 6.

Next, we discuss an arrangement of clock generating section 25. As shown in FIG. 9, the clock generating section 25 comprises a master clock generator 25A, a test voltage detector 25B and a master clock selector 25C.

Specifically, the master clock generator 25A (hereinafter, merely referred to as "clock generator") is an example of the clock generating circuits 15A, and is a circuit for generating a master clock signal CLK (hereinafter, merely referred to as "clock signal") necessary for ordinary operation. The internal arrangement of the clock generator 25A will be detailed in relation to FIG. 10.

The test voltage detector 25B is an example of voltage detector 15B, and is a circuit for detecting the state of the voltage applied to a specific terminal T1. For example, the detector 25B comprises a p-type field effect transistor TP, n-type field effect transistors TN1 through TN3, and inverters INV1 and INV2. The transistor TN3 is of the depression type.

The specific terminal T1 is connected to the drain of transistor TP, and also serves as, for example, a normal-use terminal for inputting column address A01. When the detector 25B detects a high voltage VHH applied to the specific terminal T1, it outputs a detection signal SHH to the master clock selector 25C (hereinafter, merely referred to as "selector").

The selector 25C is an example of clock switching circuits 15C, and is a circuit for selecting either of the clock switching signal CLK and the test clock signal XCLK necessary for test operation based on the detection signal SHH. The selector 25C comprises a dual input NAND gate 251, a dual input AND 252 and an inverter INV3.

The input of the dual input AND gate 252 is connected to the voltage detector 25B and the specific terminal T2.

The specific terminal T2 also serves as, for example, a normal-use terminal for receiving block address A21. The terminal T2 is supplied with the test clock signal XCLK from outside.

Figure 10:
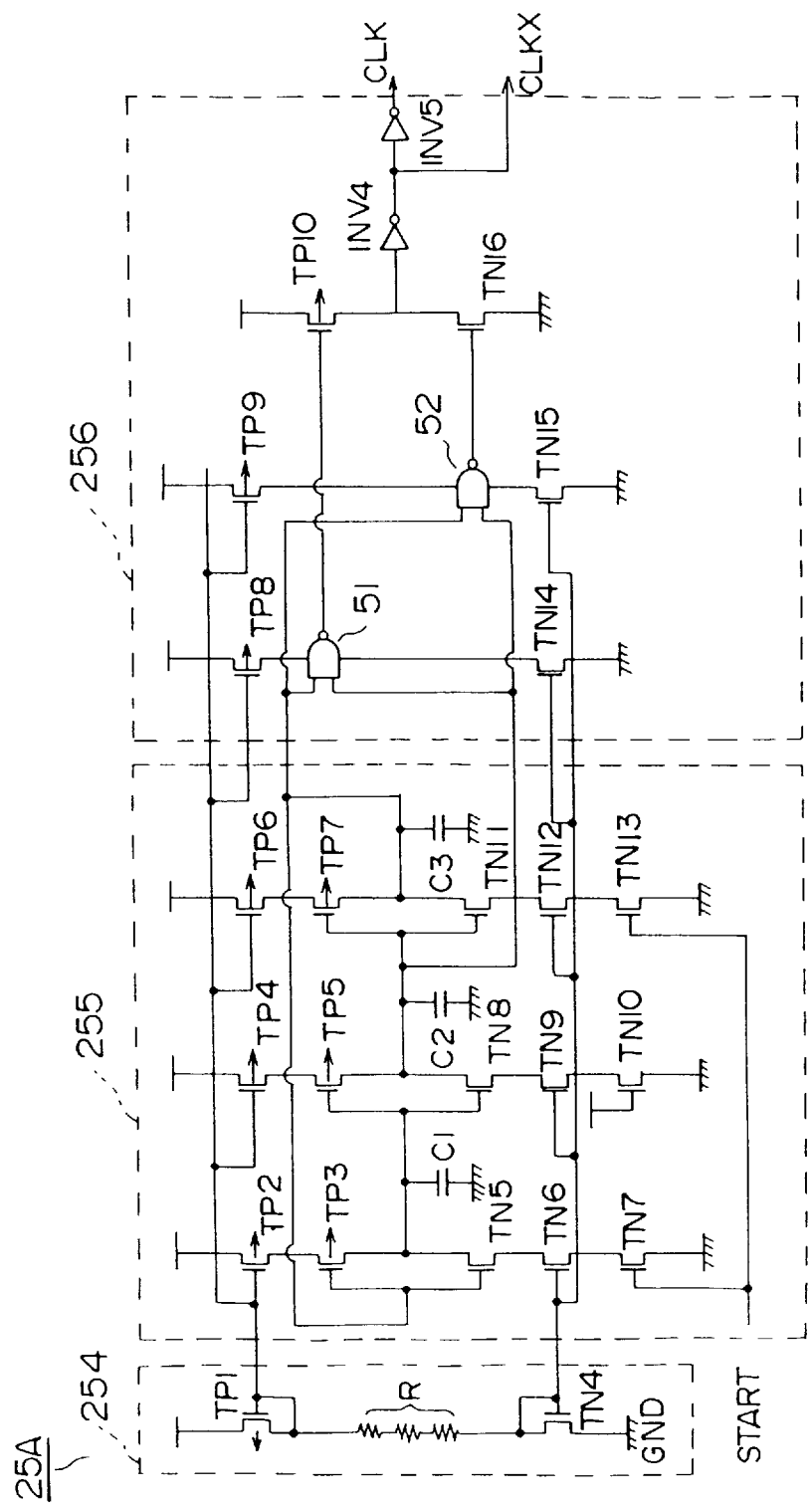
FIG. 10 is a diagram showing an arrangement of the clock generator of the clock generating section shown in FIG. 9.

Next, we discuss the internal arrangement of the clock generator 25A. As shown in FIG. 10, the clock generator 25A comprises a current bias circuit 254, a ring oscillator 255 and an output buffer 256.

The current bias circuit 254 comprises a p-type field effect transistor TP1, an n-type field effect transistor TN4 and a resistor R. The resistor R is formed of polysilicon and has high resistance. The function of the circuit 254 is to keep the charge current of the ring oscillator 255 constant by means of a current mirror circuit for keeping the oscillation frequency constant. This prevents the oscillation frequency from becoming unstable due to a change in the process condition or fluctuations in the power source voltage or the temperature.

The ring oscillator 255 comprises p-type field effect transistor TP2 through TP7, n-type field effect transistor TN5 through TN13 and capacitor C1 through C3 and generates a signal of a frequency determined by the delay time of the internal circuit.

The output buffer 256 comprises p-type field effect transistors TP8 through TP10, n-type field effect transistors TN14 through TN16, a dual input NAND gate 51, a dual input NOR gate 52 and inverters INV4 and INV5. Thus, when a start signal is set the high level, the output buffer 256 outputs the clock signal CLK and the inverted clock signal CLKX.

Figure 11:
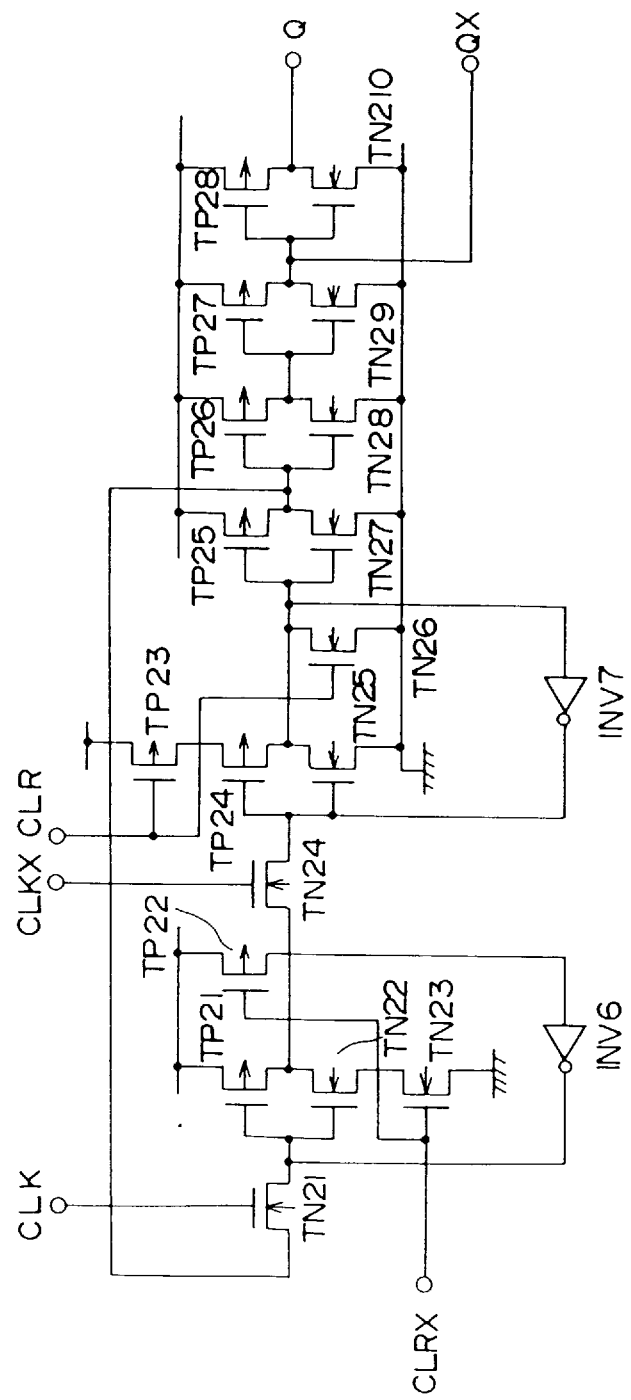
FIG. 11 is a diagram showing an arrangement of the counter of the flash memory shown in FIG. 6.

Next, we discuss the internal arrangement of the counter. FIG. 11 shows the internal arrangement of a counter according to each illustrative embodiment. For example, the circuit which composes the address counter of the write/erase timing generator 24F, as shown in FIG. 11, comprises eight p-type field effect transistors TP21 through TP28, ten n-type field effect transistors TN21 through TN210 and two inverters INV6 and INV7.

The function of this circuit is to generate counter data Q and inverted counter data QX on the basis of the clock signal CLK, the inverted clock signal CLKX, the clear signal CLR and the inverted clear signal CLR. It also generates counter data Q and inverted counter data QX even on the basis of the test clock signal XCLK, the inverted test clock signal XCLK, the clear signal CLR and the inverted clear signal CLRX.

For example, by making the signal CLR="H" level and the signal CLRX="L" level, the data Q and QX are reset, that is, the output Q is fixed to a "L" level and the output QX is fixed to an "H" level. Also, by making the signal CLR= "L" level and the signal CLRX="H" level, the counter is enabled, that is, the output Q and QX becomes "L" or "H" in response to the signals CLR and CLRX.

Figure 12:
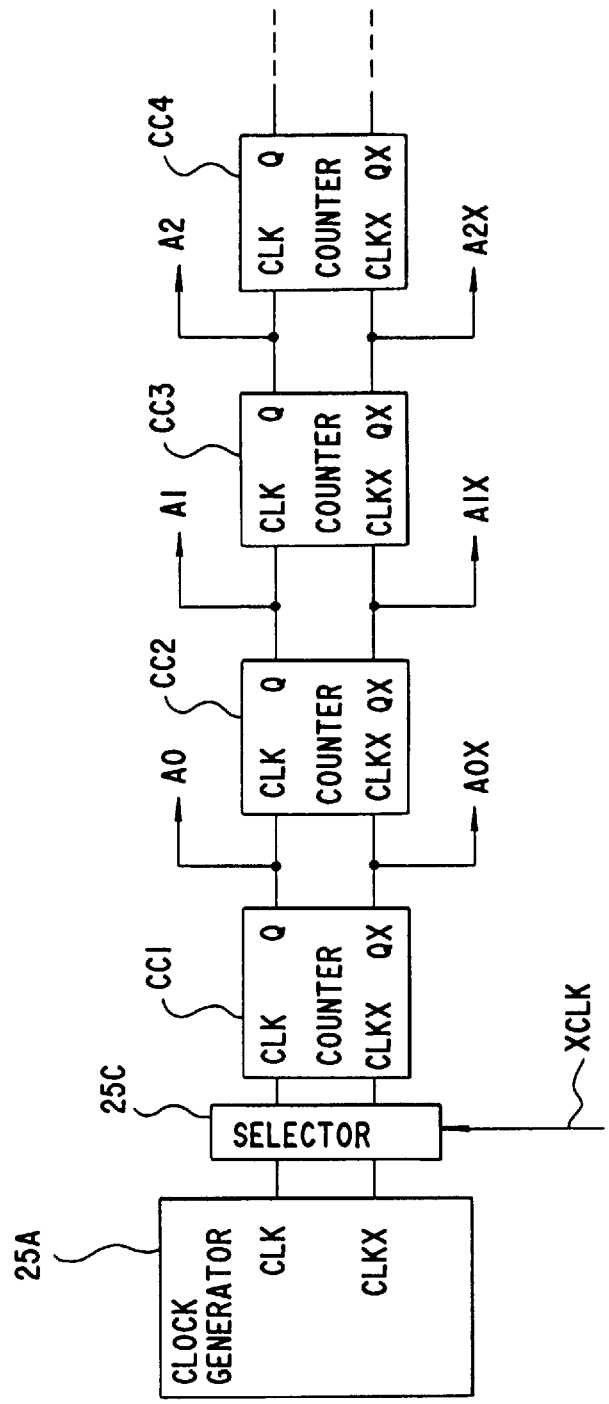
FIG. 12 is a diagram showing an arrangement of the address counter of the flash memory shown in FIG. 6.

FIG. 12 shows an exemplary arrangement of an address counter according to each illustrative embodiment of the invention. As shown in FIG. 12, the address counter is formed by connecting counters CC1, . . .,CC4 and so on. For counter CC1, the circuit shown in FIG. 11 is used.

Here, the input of the counter CC1 is connected to the selector 25C, which enables the counters to generate the address A0, A0X, A1, A1x, A2, A2x and so on sequentially on the basis of the clock signals CLK and CLKX selected by the selector or the test clock signal XCLK and inverted test clock signal XCLK. It is noted that the operation rate of the address counter is ½ of the period of the master clock signal CLK or test clock signal XCLK.

The above described write/erase timing generator 24F is provided with a timer counter for setting the write pulse period and erase pulse period. In order to compose the timer counter, counters for a desired number of stages are connected. Doing this yields data corresponding to a desired time period.

Figure 13:
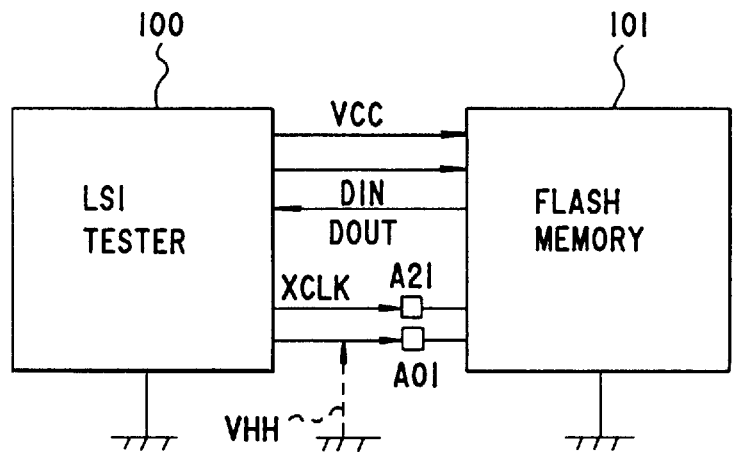
FIG. 13 is a diagram showing an illustrative arrangement of the test method for the flash memory shown in FIG. 6.

Next, we discuss the test method for flash memories according to a first embodiment of the invention. For example, when an operational test of the memory is performed by shifting from the master clock signal CLK to the external test clock signal XCLK, as shown in FIG. 13, a LSI tester and the test target or flash memory 101 are interconnected.

Here, in the condition in which the terminal for column address A01 is supplied with a voltage higher than a normal-use voltage VCC, the test clock signal XCLK is supplied through the terminal for block address A21. It should be noted that the frequency of the test clock signal XCLK is set higher than the oscillation frequency of the clock signal CLK.

Figure 14:
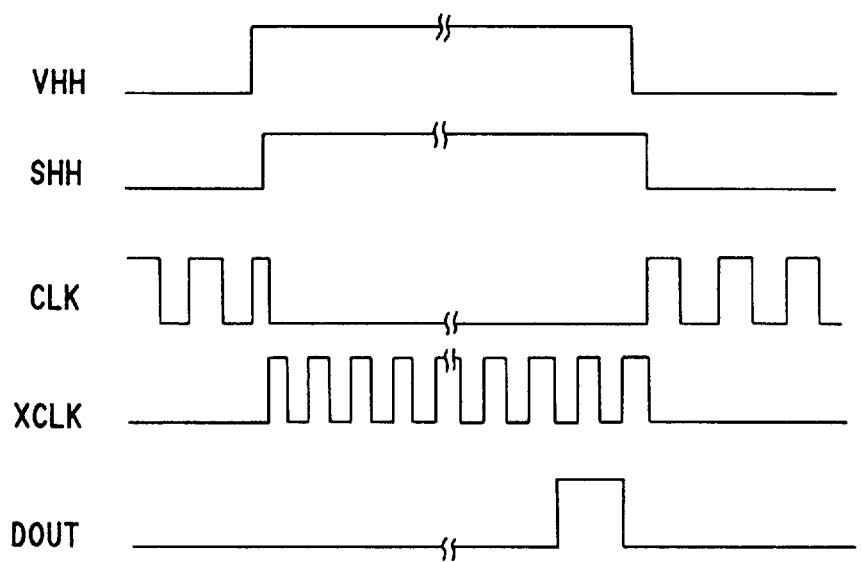
FIG. 14 is a diagram showing an illustrative timing chart of the test method for the flash memory shown in FIG. 13.
Figure 15:
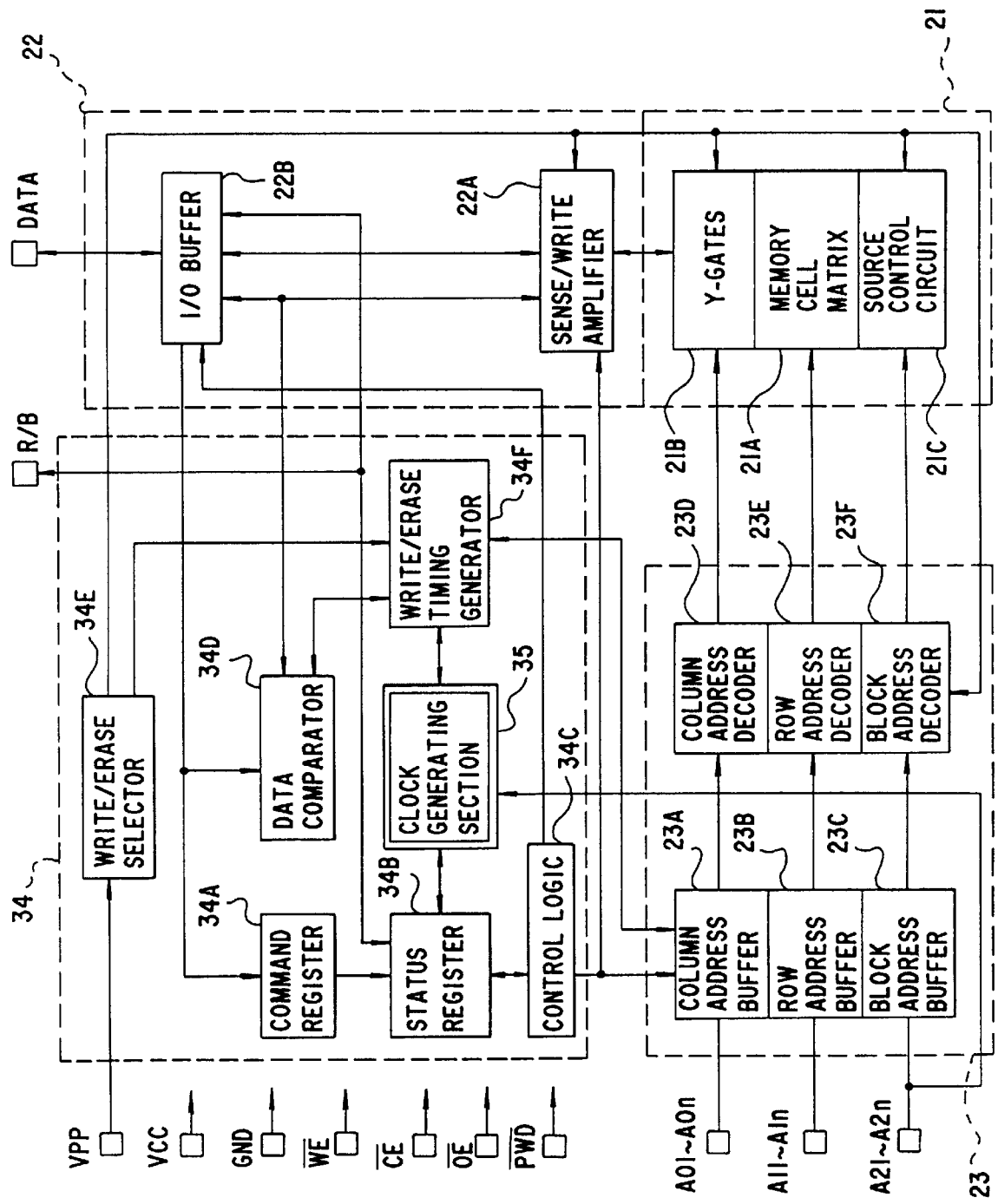
FIG. 15 is a diagram showing an arrangement of a flash memory according to a second preferred embodiment of the invention.

Thus, when the voltage VHH is detected by the voltage detector 25B as shown in FIG. 14, it is output to the selector 25C, where on the basis of the detection signal SHH is selected the test clock signal XCLK instead of the clock signal CLK. An operational test of the memory is done on the basis of the test clock signal XCLK.

Specifically, in the address decoder 23, address A0, A0X, A1, A1X, A2, A2X and so on is automatically generated on the basis of the test clock signal XCLK by means of the automatic control circuit 24. As described above in relation to FIG. 7A through 7C and FIG. 8, charges are injected into the floating gate FG of the memory array 21 on the basis of the address A0, Ax, . . . and so on by the write/read circuit 22, that is, data D is written in and a data write test is executed.

Also, in a data read test, the memory cell array 21 is set in ON operation by the write/erase circuit 22 for the automatic read out of data D. Further, in a data erase test, charges are removed from the gates FG of the memory array 21 by the write/erase circuit 22 for the automatic erase of data D.

In order for the memory to return to its normal operation, the supply of the voltage VHH is ceased to supply the addresses dependent upon the normal-use voltage VCC. This causes the selector 25C to select the clock signal CLK generated by the clock generator 25A. According to the clock signal CLK, the memory operates regularly.

In this way, as shown in FIG. 6, the flash memory in accordance with a first illustrative embodiment of the invention is provided with a memory array 21, a write/read circuit 22, an address decoder 23 and an automatic control circuit 24, which is in turn provided with a clock output circuit 25 comprising a clock generator 25A, a voltage detector 25B and a selector 25C.

Therefore, the present flash memory affords the advantage of a high speed operational test independent of the access speed in its normal operation, because an operational test of the memory is carried out on the basis of the test clock signal XCLK different in frequency from the master clock signal CLK for normal operation when as shown in FIG. 9 a test voltage is applied to the input terminal T1 of the column address A01, which is detected by the voltage detector 25B.

At the time of the operational test, the frequency of the test clock signal XCLK may be altered in the LSI tester 100 so that a high speed clock signal is supplied to the memory 101, as shown in FIG. 13. As compared with conventional examples, this reduces the period from the time of the input of the control command DIN to the time when the test results DOUT are obtained and contributes to the high speed test.

This affords the time not only for the verification test of the overall operation of the automatic control circuit 24 itself, but also for each sort of marginal tests with respect to the timing in the automatic control circuit 24, which in turn makes it possible to contrive to enhance the overall test efficiency and the precision of each sort of timing tests.

Further, according to the present invention, the external test clock signal XCLK from can be easily substituted for the internal master clock signal CLK. So, it is possible to make the automatic control circuit 24 operate from outside even when there is something abnormal with the clock generator 25A. This enables a quick detection of internal trouble, which greatly contributes to the efficiency enhancement or time reduction in the development of a novel memory.

Even if the memory capacity increases with the advance of functions and performance of information processing, the speed-up of the operational verification of the automatic control circuit 24 is promoted by the just described features, which can realize the reduction in the testing period or test cost.

(2) A Second Preferred Embodiment

In the second preferred embodiment, unlike the first embodiment, an automatic control circuit 34 is provided with a clock generating section 35, which is connected to the terminals which input the block address A20 through A22.

The flash memory according to a second preferred embodiment of the invention comprises a memory cell array 21, a write/read circuit 22, an address decoder 23 and an automatic control circuit 34.

The automatic control circuit 34 is another embodiment of the control circuit 14, and is a circuit for automatically controlling writes, erases or reads of data D. For example, the automatic control circuit 34 comprises a command register 34A, a status register 34B, a CE/OE/WE control logic 34C, a data comparator 34D, a write/erase selector 34E, a write/erase timing generator 34F and a clock generating section 35.

Figure 16:
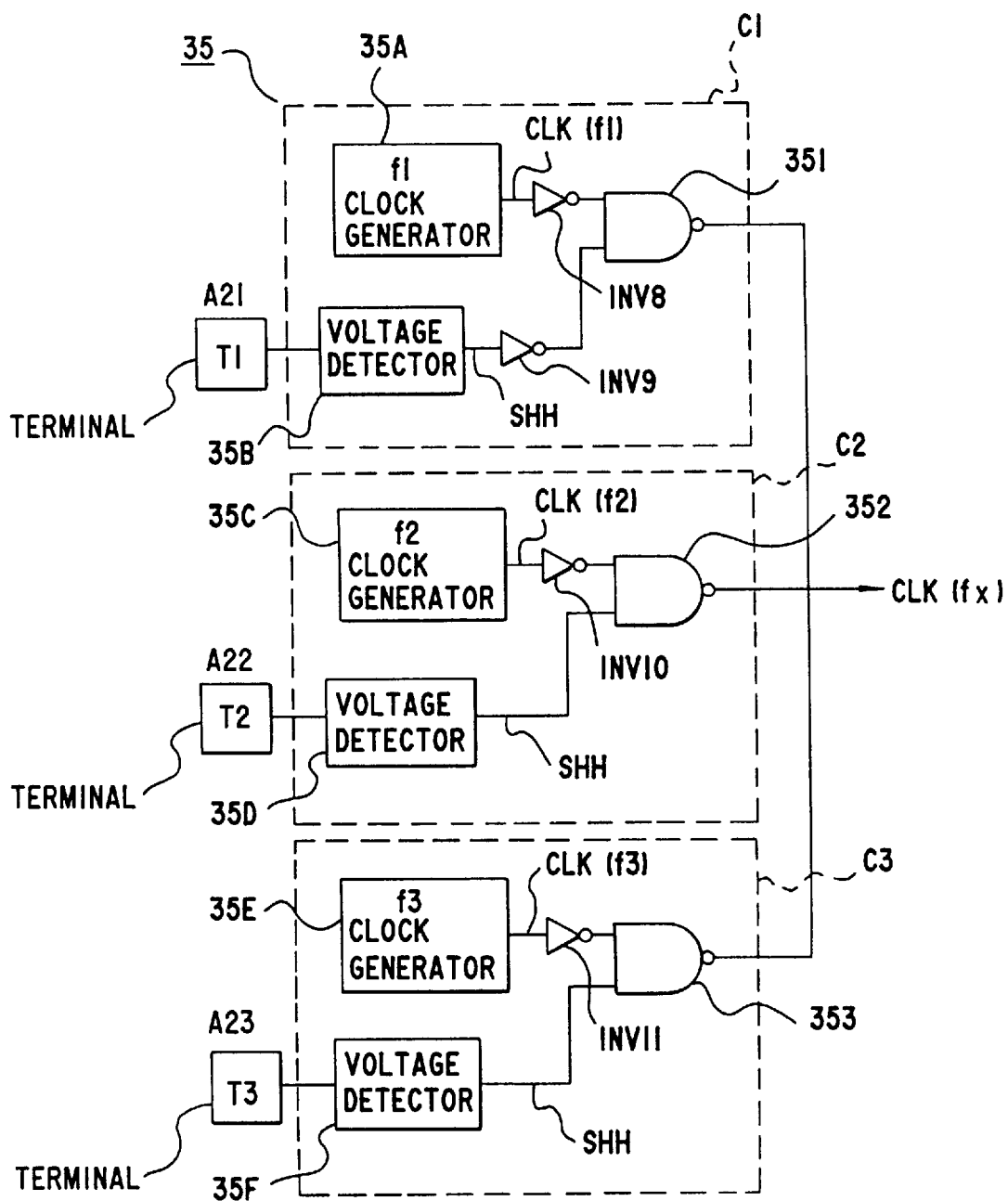
FIG. 16 is a diagram showing an internal arrangement of the clock generating part of the flash memory shown in FIG. 15.

The clock generating section 35 is another embodiment of the clock output circuit 15 and, for example, is composed of three clock generation means C1 through C3 (n=3) as shown in FIG. 16. The clock generating unit C1 comprises a clock generator 35A, a voltage detector 35B, a dual input NAND gate 351 and inverters INV8 and INV9.

The clock generator 35A is an example of clock generating circuits 15D and generates a clock signal CLK(f1) of a frequency f1 which is necessary for normal operation. The voltage detector 35B, which is an example of voltage detectors 15E, is connected to the input terminal T1 for block address A21 to detect the state of the voltage applied thereto to output a detection signal SHH to the dual input NAND gate 351.

The dual input NAND gate 351 is an example of output control circuits 15F and controls the output of the clock signal CLK(f1) on the basis of the detection signal SHH. The inverter INV8 inverts the signal CLK(f1) and the inverter INV9 inverts the signal SHH, respectively.

The clock generating unit C2 comprises a clock generator 35C, a voltage detector 35D, a dual input NAND gate 352 and an inverter INV10. The clock generator 35C generates a clock signal CLK(f2) of a frequency f2 which is necessary for test operation.

The voltage detector 35D is connected to the input terminal T2 for block address A22 to detect the state of the voltage applied thereto to output a detection signal SHH to the dual input NAND gate 352. The dual input NAND gate 352 controls the output of the clock signal CLK(f2) on the basis of the detection signal SHH. The inverter INV10 inverts the signal CLK(f2).

The clock generating unit C3 comprises a clock generator 35E, a voltage detector 35F, a dual input NAND gate 353 and an inverter INV11. The clock generator 35E generates a clock signal CLK(f3) of a frequency f3 which is necessary for test operation.

The voltage detector 35F is connected to the input terminal T3 for block address A23 to detect the state of the voltage applied thereto to output a detection signal SHH to the dual input NAND gate 353. The dual input NAND gate 353 controls the output of the clock signal CLK(f3) on the basis of the detection signal SHH. The inverter INV11 inverts the signal CLK(f3).

The functions of the memory cell array 21, the write/read circuit 22, the address decoder 23, and the functions of the command register 34A, the status register 34B, the CE/OE/WE control logic 34C, the data comparator 34D, the write/erase selector 34E, the write/erase taming generator 34F in the automatic control circuit 34 are the same as those in the first embodiment, so their explanations will be omitted.

Figure 17:
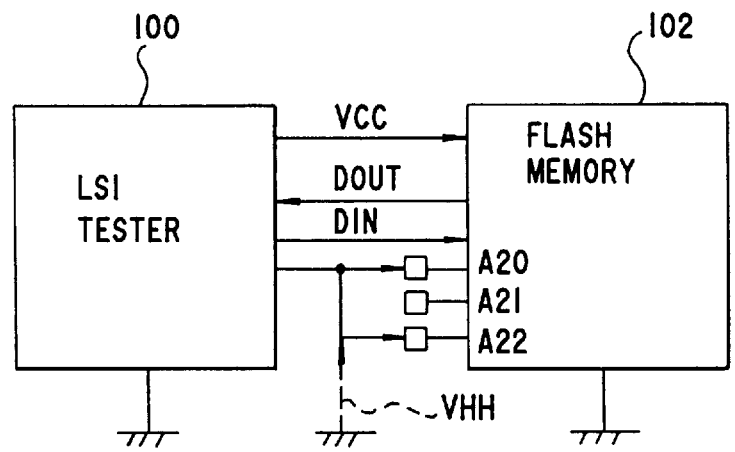
FIG. 17 is a diagram showing an illustrative arrangement of a test method for the flash memory shown in FIG. 15.

Now, we discuss the test method for flash memories according to the second illustrative embodiment of the invention. For example, in making an operational test by substituting the internal test clock signal CLK(f3) for the master clock signal CLK(f1), a LSI tester 100 and the test target or flash memory 102 are first connected as shown in FIG. 17.

In this case, the terminals for the block address A21 and A23 are kept at a voltage VHH which is higher than normally used voltage VCC. Also, when the voltage detector 35B and 35F detects the voltage VHH, they outputs detection signals SHH to the dual input NAND gates 351 and 353, respectively.

Figure 18:
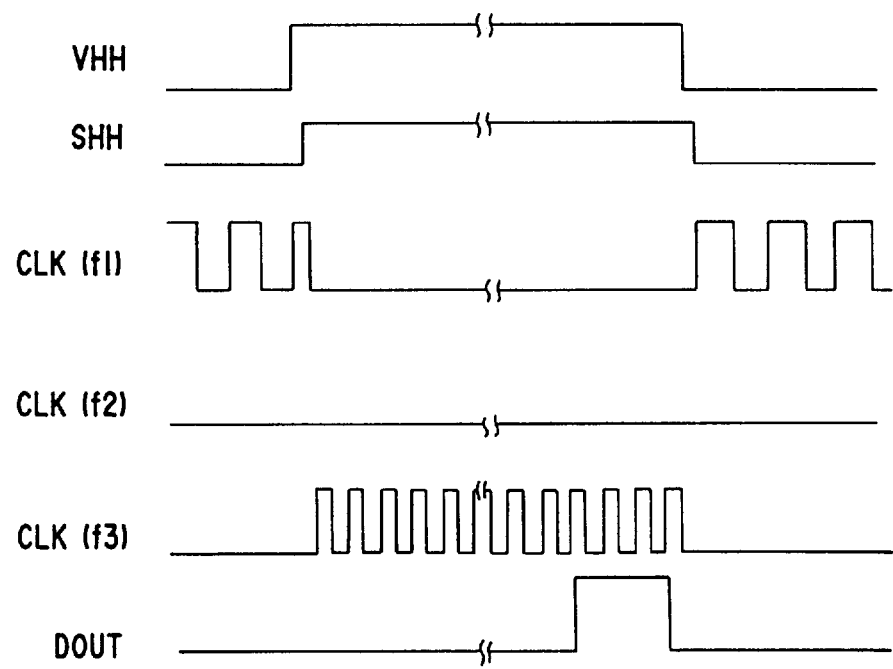
FIG. 18 is a diagram showing an illustrative timing chart of the test method for the flash memory shown in FIG. 15.

Thus, the output of the clock generating unit C1 is disabled and the output of the clock generating unit C3 is enabled, which causes the clock signal CLK(f3) necessary for test operation instead of the clock signal CLK(f1) necessary for normal operation to be output as shown in FIG. 18. In the present flash memory 102, the operational test is made on the basis of the test clock signal CLK(f3) and the resultant signal DOUT is output to the LSI tester 100.

In this way, according to the flash memory in accordance with the second illustrative embodiment of the invention, as shown in FIG. 16 there are provided three clock generation means C1 through C3 with their outputs connected together, one clock generating unit (for example C1) comprising a clock generator (in this case 35B) a voltage detector 35B and a dual input NAND gate 351.

Therefore, a high speed test of the present memory is made independently of the access speed in normal operation, since the operational test is made on the basis of the clock signal CLK(f3) of a frequency f3 which is higher than the normally used clock signal CLK(f1) and which is based on the state of the voltage applied to the terminals for the input of the column address A21 through A23.

As in case of the first embodiment, the above feature promotes the speed-up of the operational verification process for the automatic control circuit 34 and facilitates the subsequent circuit tests, which contributes the reduction in the testing period or test cost.

What is claimed is:

1. An electrical erasable programmable read only memory comprising:
   a memory cell array including a plurality of memory cells;
   a read/write/erase circuit for reading out data from said memory cells and writing data into said memory cells and erasing data stored into said memory cells;
   a read/write/erase control circuit, operatively connected to said read/write/erase circuit, for controlling a read/write/erase operation of said read/write/erase circuit;
   the read/write/erase control circuit including a clock generating circuit having
     a terminal receiving a mode selection signal, of which voltage is higher than
     a normal operating voltage of the memory, a voltage detector for detecting a voltage of the mode selection signal, a first clock generating circuit for generating a first clock signal used for normal operating of the memory, a second clock generating circuit for generating a second clock signal, having a frequency different from the first clock signal, used for test operating of the memory, a clock output circuit for selecting one of the first and second clock signals in response to an output signal from the voltage detector; and a counter receiving a clock signal from the clock output circuit, for setting a writing operation period or an erasing operation period.

2. An electrical erasable programmable read only memory of claim 1, further comprising:

a third clock generating circuit for generating a third clock signal having a frequency different from the first and second clock signals, used for a test operation of the memory;

wherein said clock output circuit selects one of the first, second and third clock signals in response to an output signal from the voltage detector.

3. An electrical erasable programmable read only memory of claim 1, further comprising:

an address decoder therein, wherein said mode selection signal is supplied through said terminal being connected to the address decoder, said address decoder being coupled to and controlled by said control circuit.

4. An electrical erasable programmable read only memory of claim 3, further comprising:

wherein said terminal connected to the address decoder is an address terminal of said memory cells.

5. A method of testing an electrical erasable programmable read only memory; said method comprising the steps of:

providing a memory cell array having a plurality of memory cells;

supplying a mode selection signal, of which voltage is higher than a normal operating voltage of the memory;

providing a read/write/erase circuit for reading out data from said memory cells and writting data into said memory cells and erasing written data in said memory cells;

providing a read/write/erase control circuit for controlling said read/write/erase circuit;

providing a first clock generating circuit for generating a first clock signal used for normal operating of the memory;

providing a second clock generating circuit for generating a second clock signal used for test operating of the memory;

providing a voltage detector for detecting a voltage of the mode selection signal;

selecting one of the first clock signal for the normal operating of the memory and the second clock signal for the test operating of the memory in response to the voltage of the mode selection signal; and setting a writing operation period or an erase operation period of the memory by counting the first clock signal or the second clock signal.

* * * * *